United States Patent [19]
Nilsson

[11] 3,953,793
[45] Apr. 27, 1976

[54] OPTIMAL DETERMINATION OF SIGNALS AFFECTED BY INTERFERENCE OR DISTURBANCE

[75] Inventor: Bruno Yngve Nilsson, Boliden, Sweden

[73] Assignee: Boliden Aktiebolag, Stockholm, Sweden

[22] Filed: Sept. 4, 1974

[21] Appl. No.: 503,179

[30] Foreign Application Priority Data
Sept. 5, 1973  Sweden .............................. 7312088

[52] U.S. Cl. .............................. 324/76 A; 324/78 J; 324/140 D
[51] Int. Cl.² ......................................... G01R 19/00
[58] Field of Search ............ 324/76 A, 78 J, 140 D; 235/196

[56] References Cited
UNITED STATES PATENTS
3,654,424  4/1972  Vanderhelst .................... 324/140 D
3,866,128  2/1975  Fletcher ............................ 324/78 J

*Primary Examiner*—R. V. Rolinec
*Assistant Examiner*—Michael J. Tokar
*Attorney, Agent, or Firm*—Stevens, Davis, Miller & Mosher

[57] ABSTRACT

The invention relates to a method and an arrangement for determining signals affected by disturbance or interference. The affected signals are continuously integrated, either directly or subsequent to suitable transformation thereof, from the very start of a measuring operation. The actual integration value is divided at determined time intervals with the actual measuring time which has elapsed at that moment from the start of said measuring operation. The quotient thus obtained is presented to an observer or a device which is arranged to interrupt the measuring operation when the value presented is substantially constant.

2 Claims, 1 Drawing Figure

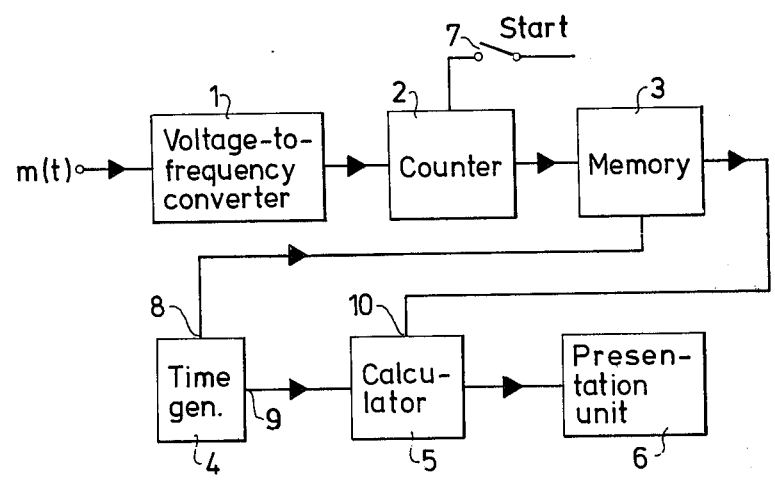

OPTIMAL DETERMINATION OF SIGNALS AFFECTED BY INTERFERENCE OR DISTURBANCE

The present invention relates to methods and apparatus for determining signals affected by interference or disturbance with the desired degree of accuracy and in a theoretically minimum measuring time. The invention can be applied for the determination of the desired average value of signals in the presence of disturbance signals or interference. The equation $$\frac{1}{T}\int_0^T s(t)\,dt = s$$

is true for the true signal $s(t)$, i.e. the signal of interest, or said signal transformed. In general, the signal information $s(t)$ is deterministic and periodic although it may be aperiodic if its characteristics are known. The equation $$\lim_{T \to \infty} \frac{1}{T}\int_0^T n(t)\,dt = 0$$

is true for the false interference or disturbance signal $n(t)$ or said signal transformed, the false signal being that which is of no interest. That is, this noise signal is a stochastic signal varying in positive and negative directions in such a manner that — if the measuring time T is sufficiently long — these positive and negative variations will nullify each other giving a zero average value.

The direct or transformed, affected signal $m(t)$ comprises the sum of the true signal and the false or disturbance signal, i.e. $m(t) = s(t) + n(t)$.

With a known and generally applied method, the signal $m(t)$ is applied to an integration system in which the integral $$\frac{1}{T}\int_0^T m(t)\,dt = \frac{1}{T}\int_0^T s(t)\,dt + \frac{1}{T}\int_0^T n(t)\,dt$$

is determined for a time interval [O, T]. The time T is designated the integration time of the apparatus. The relationship $$\frac{1}{T}\int_0^T m(t)\,dt = \frac{1}{T}\int_0^T s(t)\,dt = s$$

applies when T is infinitely great (T → ∞). In general the amplitude and spectral distribution of $n(t)$ is unknown.

Particular values of $s$, s, can be determined with the desired degree of accuracy by adapting the integration time to the extent of the prevailing interference or disturbance $n(t)$, i.e. so that the influence of said interference is so small that the desired value s is obtained with sufficient accuracy. Normally, the integration time is fixed or indexibly selectable.

The task of establishing with such apparatus whether or not the integration time selected is the most suitable with regard to the prevailing level of interference is time consuming, because it is necessary to repeat the measuring operation a number of times. The total measuring time is therewith great, particularly when the disturbance or interference level is high.

The object of the invention is to provide a method and apparatus with which the total measuring time is the shortest theoretically possible for any reasonable degree of disturbance or interference and any particular desired degree of accuracy. The time gained when using the method and apparatus of the present invention is particularly great in cases when the level of the interference or disturbance is high and not known.

In accordance with the method according to the invention, the integration time of the apparatus increases in step with the duration of the measuring time. The integration time is preferably identical with the measuring time. Presentation of the measurement value can be made at desired time intervals. When effecting a measuring operation in accordance with this method, the measurement values presented fluctuate with successively lower amplitudes as the measuring time increases, said values becoming stable to the desired degree when an integration time corresponding to the interference or disturbance level is reached, said time in this case being equal to the meausring time. Thus, the measuring time is adjusted by the person supervising the presentation device or automatically by the device itself in an optimal manner, to the disturbance or interference lever prevailing at that moment of the measuring sequence, the desired value $\underline{s}$ being obtained therewith within the shortest possible measuring time. More specifically, during the measuring operation the display is observed by a supervising operator and new values are presented upon the display with predetermined time intervals between each new presentation. In the beginning of a measuring period, the displayed values will fluctuate from presentation time to presentation time, at least in the less significant digit positions of the display, but eventually — as the influence of the disturbing noise is successively reduced — the presented values will be more and more constant and a stabilization of the reading will thus be obtained. When the digit of the least significant position remains constant from presentation time to presentation time and thus has ceased to fluctuate, a measuring value s being free from disturbances $n(t)$ — i.e., $n(t) = 0$ and thus $m(t) = s(t)$ — is thus obtained with a degree of accuracy determined by the least significant digit position of the display, that is a practically satisfactory value of $\underline{s}$. Furthermore, this value of $\underline{s}$ has been obtained in the shortest possible time.

If the operation is automatic, there is of course no need for any operator monitoring the measuring device continuously. In such a case a sensor is adapted to sense the values of the digit positions and to automatically stop the measuring operation when the value of the least significant digit position has ceased to fluctuate and to record the stabilized value of s thereby obtained.

The method according to the invention is mainly characterized by continuously integrating the direct or transformed, affected signals from the very start of a measuring operation; dividing the actual integration value at determined time intervals with the actual measuring time which has lapsed from the start of the measuring operation; and presenting the thus obtained quotient to an observer or a device which is arranged to interrupt the measuring operation when the presented signal value has a substantially constant value.

An apparatus for putting the method of the invention into effect comprises a voltage-to-frequency converter to which the measuring signal is applied and which is arranged to produce a pulse train having a frequency which is proportional to the value of the measurement signal, a counter to which said pulse train is applied and which is arranged to total the incoming pulses thereto, a time generator which is arranged to measure the time from the beginning of the measuring operation and to produce at determined time intervals an opening signal on one ouptut and, at the same time, a signal corresponding to the measuring time which has currently elapsed on a second output, a memory device connected to the output of said counter and arranged to receive, upon receipt of said opening signal, the total value of the pulses added in the counter, a calculator having an input arranged to receive said total value from said memory device and also having a second input which is arranged to receive the signal value corresponding to the measuring time which has currently elapsed and to divide said total value with said signal value and to apply the thus obtained quotient to a presentation unit.

The invention will now be described in more detail with reference to the accompanying drawing, which has the form of a block diagram and which show graphically an apparatus for putting the method of the invention into effect.

The illustrated apparatus comprises a voltage-to-frequency converter 1. The measuring signal $m(t)$ is applied to the input of the converter 1 and is there converted to a pulse train having a frequency proportional to the measuring value. Connected to the converter 1 is a counter 2 which is arranged to receive said pulse train and to total the pulses therein. The counter is set to zero at the commencement of a measuring sequence, this being effected by a switch diagramatically shown at 7. A memory 3 is connected to the counter 2 and to a calculator 5 and a time generator 4. The time generator 4 is arranged to produce opening signals for the memory 3 at determined time intervals, said signals being applied to the memory 3 from the output 8 of the time generator. In this way the memory 3 is opened to the counter 2 to obtain therefrom the pulse total value present therein at that particular moment. The rate at which the pulse total values are extracted is determined by the desired interval between the presentations of the measuring values. The time generator 4 is also arranged to produce time information corresponding to the measuring time which has elapsed at that particular moment from the start of the measuring sequence, this information being applied on output 9 to the calculator 5 which, at the same time, obtains on its other input 10 the accumulated measuring value from the memory 3. The calculator 5 then divides the accumulated value with the measuring value obtained from the time generator 4 and the quotient thus obtained is applied to a presentation unit 6. The presentation unit 6 is arranged to show the desired measuring value. The measurements are made automatically at the said time interval and each time there is presented a new measurement value on the presentation unit 6. When stabilization of the measurement values successively obtained on the unit occurs, this means that said unit shows the desired disturbance-free measurement value, and the observer or device arranged to supervise the presentation unit can interrupt the operation of the measuring appartus, whereupon the various units of said apparatus are set to zero.

I claim:

1. A method of determinine a true signal in the presence of an interfering signal, said true and interfering signals combining to form a measuring signal, comprising the steps of:

continuously integrating said measuring signal to provide a plurality of integrated values, generating a plurality of time signals measured from the beginning of said continuous integration, dividing the integrated values corresponding to each of said plurality of time signals by the corresponding time signal to obtain a plurality of quotient signals, and presenting said quotient signals, said quotient signals fluctuating in value near the beginning of said integration and becomming substantially constant as said integration continues and the influence of said interfering signal is reduced.

2. Apparatus for determining a true signal in the presence of an interfering signal, said true and interfering signals combining to form a measuring signal, comprising: voltage-to-frequency converter means for receiving said measuring signal and generating a pulse train having a frequency proportional to the value of said measuring signal, counter means for receiving said pulse train and generating an output corresponding to the sum of the pulses in said pulse train, means for initiating a measuring sequence coupled to said counter, time generator means having first and second outputs, said time generator generating an opening signal at determined time intervals at said first output and simultaneously an elapsed time signal corresponding to the time from initiation of said measuring sequence at said second output, memory means having an output, a first input coupled to the output of said counter and a second input coupled to the first output of said time generator, said memory means storing the output of said counter upon receipt of the opening signal generated at the first output of said time generator, calculator means having an output, a first input coupled to the output of said memory device and a second input coupled to the second output of said time generator, said calculator dividing the output of said memory device by the elapsed time signals at the second output of said time generator to obtain a plurality of quotient signals, and presentation means coupled to the output of said calculator for presenting said quotient signals.

* * * * *